United States Patent
Brandenberger et al.

(10) Patent No.: US 7,210,077 B2
(45) Date of Patent: Apr. 24, 2007

(54) SYSTEM AND METHOD FOR CONFIGURING A SOLID-STATE STORAGE DEVICE WITH ERROR CORRECTION CODING

(75) Inventors: Sarah Morris Brandenberger, Boise, ID (US); Terrel Munden, Boise, ID (US); Jonathan Jedwab, Vancouver (CA); James Davis, Richmond, VA (US); David Banks, Henleaze (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 512 days.

(21) Appl. No.: 10/767,188

(22) Filed: Jan. 29, 2004

(65) Prior Publication Data

US 2005/0172179 A1  Aug. 4, 2005

(51) Int. Cl.
  *G11C 29/00* (2006.01)
  *H03M 13/35* (2006.01)
(52) U.S. Cl. ............... 714/708; 714/773; 714/774
(58) Field of Classification Search ........... 714/708, 714/773, 774
  See application file for complete search history.

(56) References Cited

U.S. PATENT DOCUMENTS

| | | | | |
|---|---|---|---|---|
| 5,961,660 A * | 10/1999 | Capps et al. | ........... | 714/763 |
| 6,169,686 B1 | 1/2001 | Brug et al. | | |
| 6,526,537 B2 * | 2/2003 | Kishino | ........... | 714/763 |
| 6,560,725 B1 * | 5/2003 | Longwell et al. | ........... | 711/105 |
| 6,584,543 B2 * | 6/2003 | Williams et al. | ........... | 711/105 |
| 6,697,992 B2 * | 2/2004 | Ito et al. | ........... | 714/763 |
| 6,941,505 B2 * | 9/2005 | Yada et al. | ........... | 714/763 |
| 6,961,890 B2 * | 11/2005 | Smith | ........... | 714/763 |
| 7,032,158 B2 * | 4/2006 | Alvarez et al. | ........... | 714/763 |
| 2003/0023922 A1 | 1/2003 | Davis et al. | | |
| 2003/0023925 A1 | 1/2003 | Davis et al. | | |
| 2003/0023928 A1 | 1/2003 | Jedwab et al. | | |

FOREIGN PATENT DOCUMENTS

EP  0918334 A2  5/1999

* cited by examiner

*Primary Examiner*—Stephen M. Baker

(57) ABSTRACT

A system for configuring solid-state storage devices comprises a solid-state storage device and an error correction code (ECC) selection system. The ECC selection system is configured to automatically select a set of error correction code based on an error rate of the storage device. The ECC selection system is further configured to install the selected set of error correction code in the solid-state storage device.

22 Claims, 7 Drawing Sheets

SYSTEM AND METHOD FOR CONFIGURING A SOLID-STATE STORAGE DEVICE WITH ERROR CORRECTION CODING

FIELD OF THE INVENTION

Embodiments of the present invention relate, in general, to data storage devices and, in particular, to systems and methods for configuring solid-state storage devices with error correction coding.

BACKGROUND OF THE INVENTION

A typical solid-state storage device comprises one or more arrays of storage cells for storing data. Existing semiconductor technologies provide volatile solid-state storage devices suitable for relatively short term storage of data, such as dynamic random access memory (DRAM), or devices for relatively longer term storage of data such as static random access memory (SRAM) or non-volatile flash and electrically erasable programmable read-only memory (EEPROM) devices.

A magnetoresistive storage device has been developed as a new type of non-volatile solid-state storage device. The magnetoresistive solid-state storage device is also known as magnetic random access memory (MRAM device. MRAM devices have relatively low power consumption and relatively fast access times, particularly for data write operations, which render MRAM devices ideally suited for both short term and long term storage applications.

A problem arises in that MRAM devices are subject to physical failure, which can result in an unacceptable loss of stored data. Physical failures within a MRAM device can result from many causes including manufacturing imperfections, internal effects such as noise in a read process, environmental effects such as temperature and surrounding electromagnetic noise, or ageing of the device in use. Failures can generally be classified as either systematic failures or random failures. Systematic failures consistently affect a particular storage cell or a particular group of storage cells. Random failures occur transiently and are not consistently repeatable. Systematic failures can arise as a result of manufacturing imperfections and ageing. Random failures occur in response to internal effects and to external environmental effects.

Currently available manufacturing techniques for MRAM devices are subject to limitations, and as a result, manufacturing yields of acceptable MRAM devices are relatively low. Although better manufacturing techniques are being developed, these tend to increase manufacturing complexity and cost. It is also desirable to increase cell density formed on a substrate such as silicon, but as the density increases, manufacturing tolerances become increasingly difficult to control, leading to higher error rates and lower device yields.

Currently, error correction coding implemented with memory to remedy manufacturing defects affecting memory accuracy is of one pre-determined size regardless of the level of accuracy of the memory or the intended application of the memory. Typically, the one pre-determined size is the most powerful level of ECC available. However, where the actual defect level of the MRAM device is not taken into account, error correction coding with a higher level of correction capability ("power level") may be installed for use with an MRAM device than is needed to provide an acceptably accurate device. Similarly, where the intended application of the MRAM device is not taken into account prior to installing the error correction coding, error correction coding capable of a higher accuracy level than is necessary for the intended application may be implemented. Use of over-corrective (higher "power level" than necessary) ECC can unnecessarily slow the speed of operations performed by the device with which the ECC is used and requires greater power to run the machine in which the device is installed.

SUMMARY OF THE DISCLOSURE

The present disclosure relates to systems and methods for configuring solid-state storage devices with error correction coding.

A system in accordance with one exemplary embodiment of the present disclosure comprises a solid-state storage device and an error correction code (ECC) selection system. The ECC selection system is configured to automatically select a set of error correction code based on an error rate of the storage device. The ECC selection system is further configured to install the selected set of error correction code in the solid-state storage device.

BRIEF DESCRIPTION OF THE DRAWINGS

Exemplary embodiments of the invention can be better understood with reference to the following drawings. The components in the drawings are not necessarily to scale, emphasis instead being placed upon clearly illustrating the principles of the present invention.

DETAILED DESCRIPTION

The disclosed apparatus, systems and methods can be used to select an appropriate error correction code (ECC) for installation and use with a solid-state storage device. Solid-state storage devices can be used with error correction coding to lessen the severity of errors in the solid-state storage device as manufactured or as deteriorated through time. As used herein, various information can be analyzed regarding both the solid-state storage device and its intended use to select an appropriate error correction code.

Figure 1:
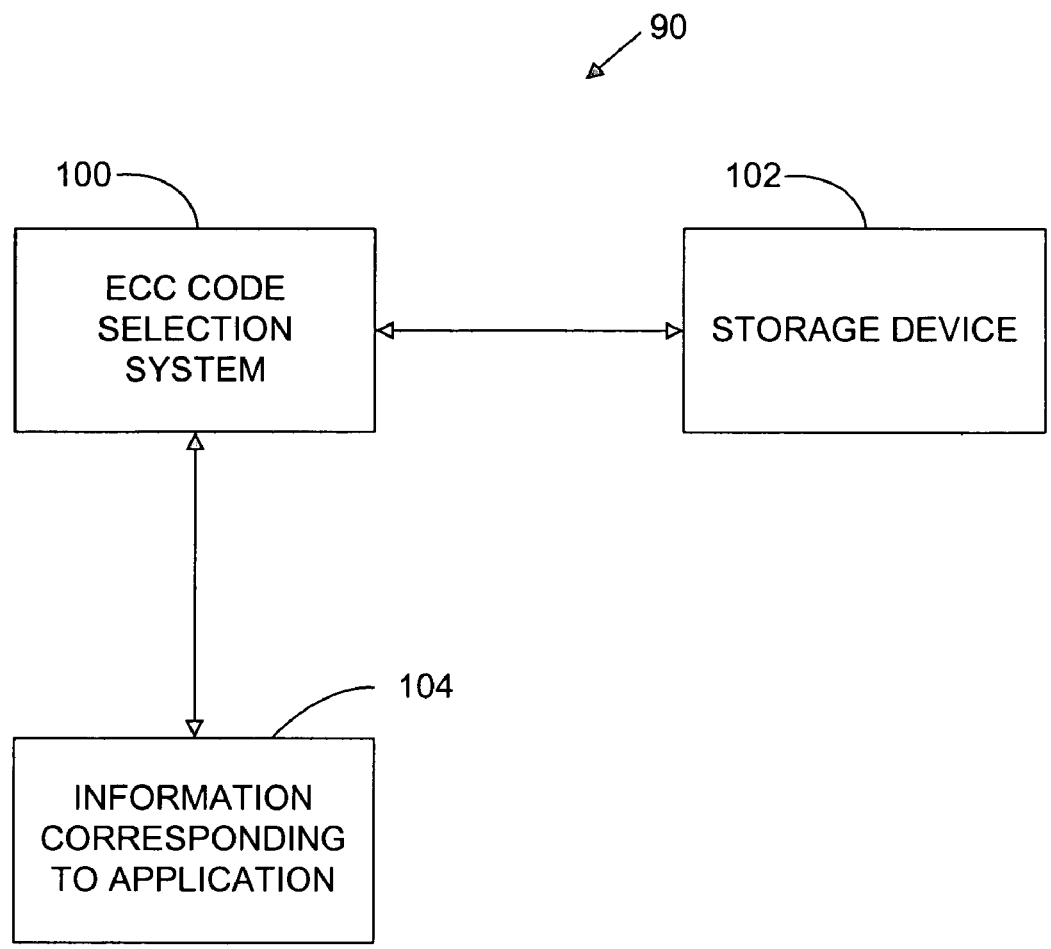
FIG. 1 is a schematic diagram of an embodiment of an ECC selection system according to the present invention.

Referring now to the drawings, wherein like reference numerals indicate corresponding components throughout the several views, FIG. 1 is a schematic diagram depicting an embodiment of an example storage device configuration system 90. As shown in FIG. 1, the system 90 comprises an ECC selection system 100 that communicates with a storage device 102 with which the ECC selection system 100 will be used. The ECC selection system 100 also can receive information 104 corresponding to the application of the storage device 102 with which the selected ECC will be implemented.

Figure 2:
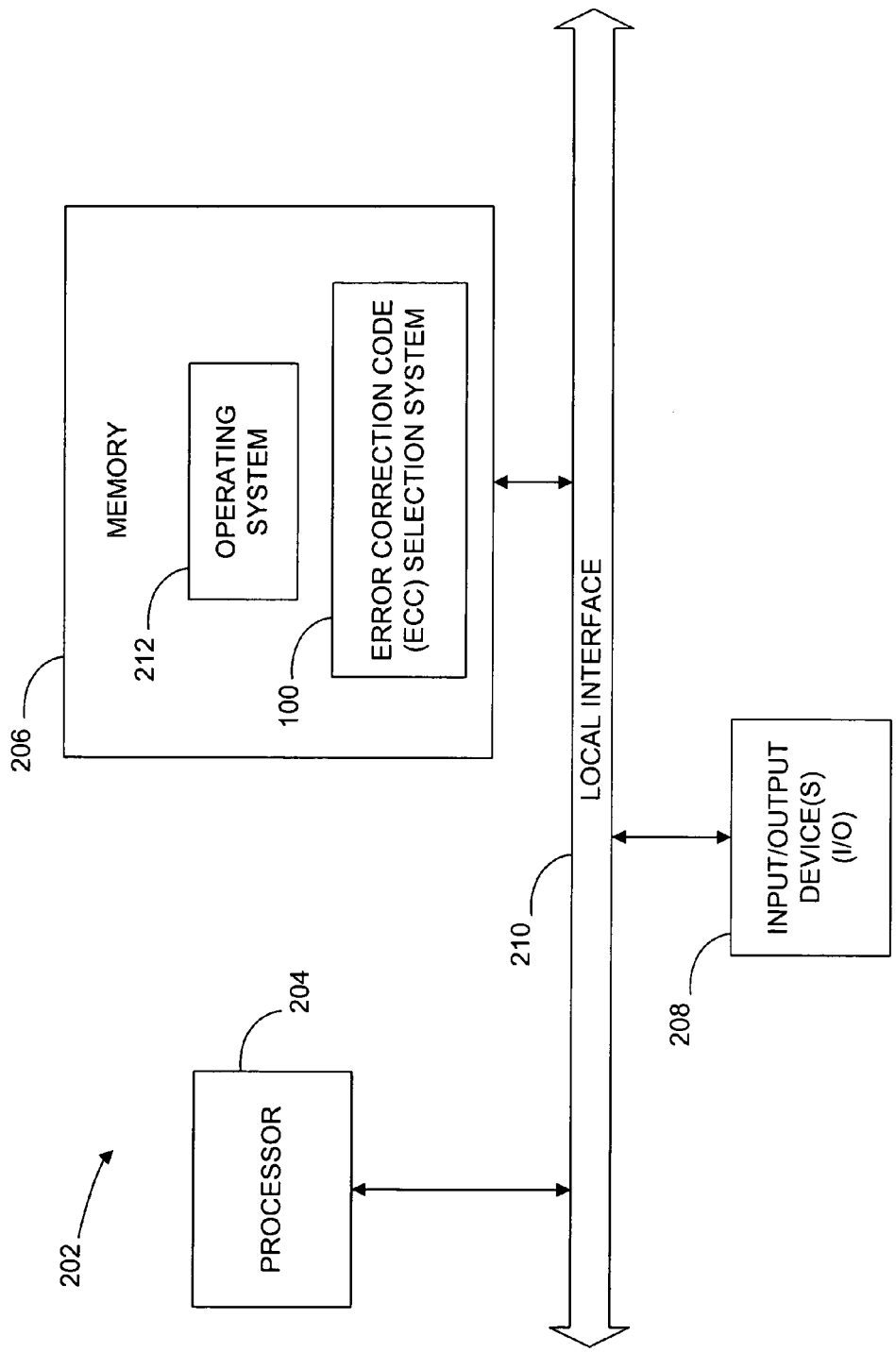
FIG. 2 is a schematic representation of a processing system for implementing an embodiment of an ECC selection system.

FIG. 2 is a schematic representation of a processing system 202 for implementing at least a portion of an embodiment of an ECC selection system 100. The ECC selection system 100 can be implemented in software, firmware, hardware, or a combination thereof. When implemented in software, the ECC selection system 100 can be a program that is executable by the processing system 202 depicted schematically in FIG. 2.

Generally, in terms of hardware architecture, the system 202 of FIG. 2 includes a processor 204, memory 206, and one or more input and/or output (I/O) devices 208 (or peripherals) that are communicatively coupled via a local interface 210. Local interface 210 can be, for example, one or more buses or other wired or wireless connections. Local interface 210 can include additional elements, which are omitted for ease of description. These additional elements can be controllers, buffers (caches), drivers, repeaters, and/or receivers, for example. Further, the local interface may include address, control, and/or data connections to enable appropriate communications among the components of the system 202.

Processor 204 can be a hardware device configured to execute software that can be stored in memory 206. Processor 204 can be any custom-made or commercially available processor, a central processing unit (CPU) or an auxiliary processor among several processors.

Memory 206 can include any combination of volatile memory elements (e.g., random access memory (RAM, such as DRAM, SRAM)) and/or nonvolatile memory elements (e.g., ROM, hard drive, tape, CDROM). Moreover, memory 206 can incorporate electronic, magnetic, optical, and/or other types of storage media. Note that memory 206 can have a distributed architecture, where various components are situated remote from one another, but can be accessed by processor 204.

The software in memory 206 can include one or more separate programs, each of which comprises an ordered listing of executable instructions for implementing logical functions. The software in the memory 206 includes ECC selection system 100 and a suitable operating system (O/S) 212. The operating system 212 controls the execution of other computer programs, such as the ECC selection system 100. Operating system 212 also can provide scheduling, input-output control, file and data management, memory management, and communication control and related services.

The I/O device(s) 208 can include input devices, such as a keypad and/or a receiver, for example. I/O device(s) 208 also can include output devices, such as a display device and/or a transmitter, for example. I/O device(s) 208 may further include devices that are configured to communicate both inputs and outputs, such as a network communication port, for example.

When the system 202 is in operation, processor 204 is configured to execute software stored within the memory 206, communicate data to and from the memory 206, and generally control operations of the computer 202. ECC selection system 100 and the O/S 212, in whole or in part, are read by the processor 204, perhaps buffered within processor 204, and then executed.

When ECC selection system 100 is implemented in software, it can be stored on any computer-readable medium for use by or in connection with any computer-related system or method. In the context of this document, a computer-readable medium is an electronic, magnetic, optical, or other physical device or means that can contain or store a computer program for use by or in connection with a computer-related system or method. ECC selection system 100 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

As used herein, a "computer-readable medium" can be any means that can store, communicate, propagate or transport an information program for use by or in connection with an instruction execution system, apparatus, or device. Thus, a computer-readable medium can be, for example but not limited to, an electronic, magnetic, optical, electromagnetic, infrared, or semiconductor system, apparatus, device, or propagation medium. Note that the computer-readable medium could even be paper or another suitable medium upon which the program is printed, as the program could be electronically captured, via optical scanning of the paper or other medium, then compiled, interpreted or otherwise processed in a suitable manner, if necessary, and then stored in a computer memory.

When implemented in hardware, ECC selection system 100 can be implemented with any or a combination of various technologies. By way of example, the following technologies, which are each well known in the art, can be used: a discrete logic circuit(s) having logic gates for implementing logic functions upon data signals, an application specific integrated circuit (ASIC) having appropriate combinational logic gates, a programmable gate array(s) (PGA), and a field programmable gate array (FPGA).

Figure 3:
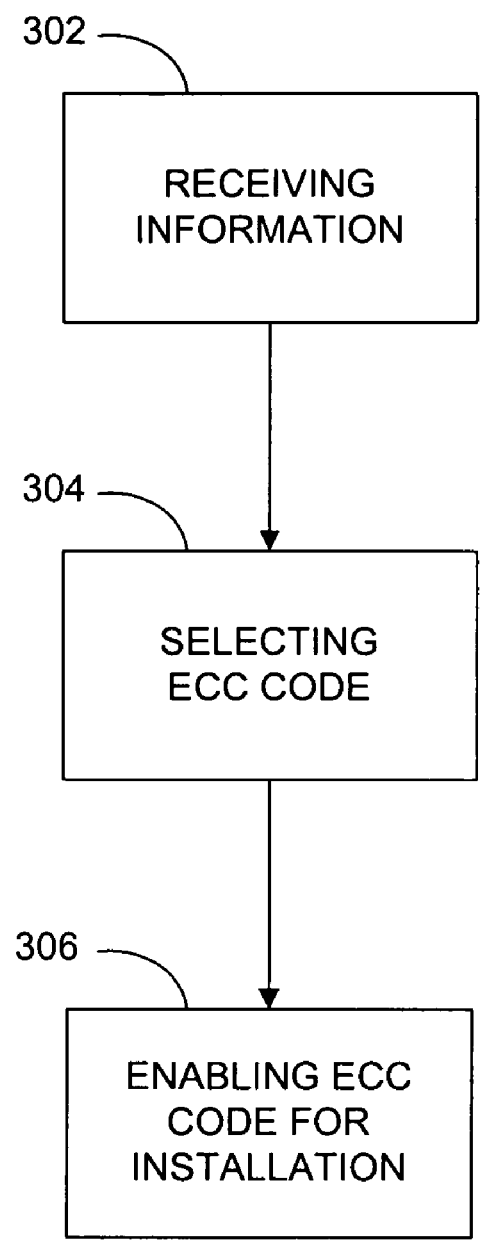
FIG. 3 is a flowchart depicting representative functionality of the embodiment of the ECC selection system depicted in FIG. 2.

As illustrated by block 302 of FIG. 3, the ECC selection system may receive, from the storage device 202 or other component, information 104 regarding the application of the storage device 102. In block 304, the appropriate ECC can be selected based, at least in part, on the information received in block 302. For example, where the information received indicates that the storage device 102 was manufactured with a high level of deficiency, or that the storage device 102 has deteriorated and developed a high level of deficiency through time, and the application with which the storage device 102 will be implemented requires a high level of accuracy, a very robust ECC will be selected. In block 306, the ECC selection system 100 enables the selected ECC for installation.

An example MRAM device 400 is described with reference to FIG. 4. The ECC selection methods adopted in an embodiment of the present invention aim to reduce the adverse effects of physical failures, taking into account that such physical failures vary from device to device, while minimizing memory and power usage to achieve a desired error correction. ECC selection can also be achieved by taking into account the intended user application of the MRAM device.

Figure 4:
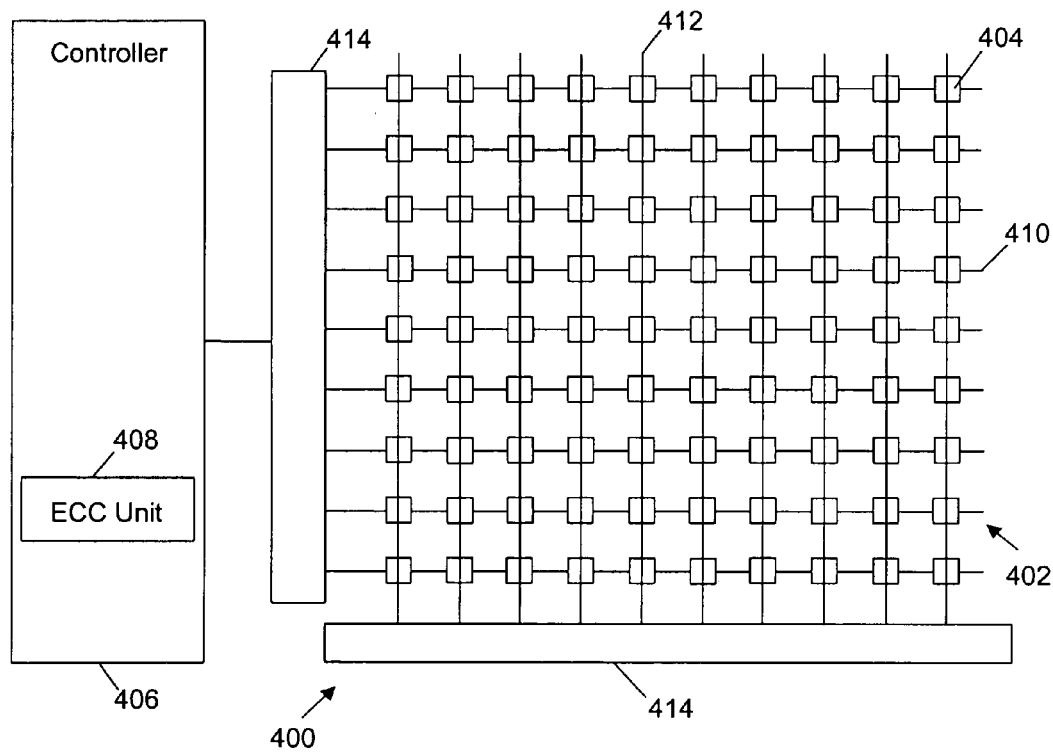
FIG. 4 is a schematic diagram showing an MRAM device including an array of storage cells.

The MRAM device 400 of FIG. 4 comprises an, array 402 of storage cells 404. The array 402 is coupled to a controller 406, which, amongst other control elements, includes an ECC coding and decoding unit 408. During operation, the unit 408 performs error correction using the ECC selected and installed by the ECC selection system 100 (FIG. 1), as will be described in more detail hereafter. The controller 406 and the array 402 can be formed on a single substrate, or can be arranged separately. Commonly-assigned U.S. Pat. No. 6,169,686 discloses one example of a magnetoresistive solid-state storage device suitable for use in embodiments of the present invention, the disclosure of which is hereby incorporated by reference.

In one embodiment, the array 402 comprises on the order of 1024 by 1024 storage cells 404, just a few of which are illustrated. It should be understood, however, that the array 402 can comprise any number of storage cells 404. The storage cells 404 are each formed at an intersection between control lines 410 and 412. In this example, control lines 410 are arranged in rows, and control lines 412 are arranged in columns. The control lines 410 and 412 are generally orthogonal, but other more complicated lattice structures are also possible. The row and column lines 410, 412 are coupled to control circuits 414, which include a plurality of read/write control circuits. Depending upon the implementation, for example, one read/write control circuit is provided per column, or read/write control circuits are multiplexed or shared between columns.

In a device access, such as a write operation or a read operation, one row 410 and one or more columns 412 are selected by the control circuits 414 to access the required storage cell or cells 404 (or conversely one column and several rows, depending upon the orientation of the array). The MRAM device, for example, can have a minimum distance m, such as, for example, sixty-four cells, between the selected column lines 412 to minimize cross-cell interference. Given that each array 402 has rows of length l, such as, for example, 1024 storage cells, it is possible to access simultaneously up to $l/m=1024/64=16$ uniquely addressable cells from the array 402.

Each storage cell 404 stores one bit of data representing a numerical value, such as a binary value, i.e. one or zero. As such, each storage cell includes two films, which assume one of two stable magnetisation orientations, known as parallel and anti-parallel. The magnetisation orientation affects the resistance of the storage cell 404. When the storage cell 404 is in the anti-parallel state, the resistance is at its highest, and when the magnetic storage cell 404 is in the parallel state, the resistance is at its lowest. The high resistance anti-parallel state defines a "0" logic state, and the low resistance parallel state defines a "1" logic state, or vice versa. In one embodiment, the resistance of each storage cell 404 is determined according to a phenomenon known as spin tunnelling, and the cells are referred to as magnetic tunnel junction storage cells. The condition of the storage cell is determined by measuring the sense current (proportional to resistance) or a related parameter such as response time to discharge a known capacitance, which gives one or more parametric values for each storage cell 404. A logical value can then be derived from the obtained parametric value or values. Depending upon the nature and construction of the MRAM device 400, the read operation may comprise multiple steps or require combined read and rewrite actions.

Figure 5:
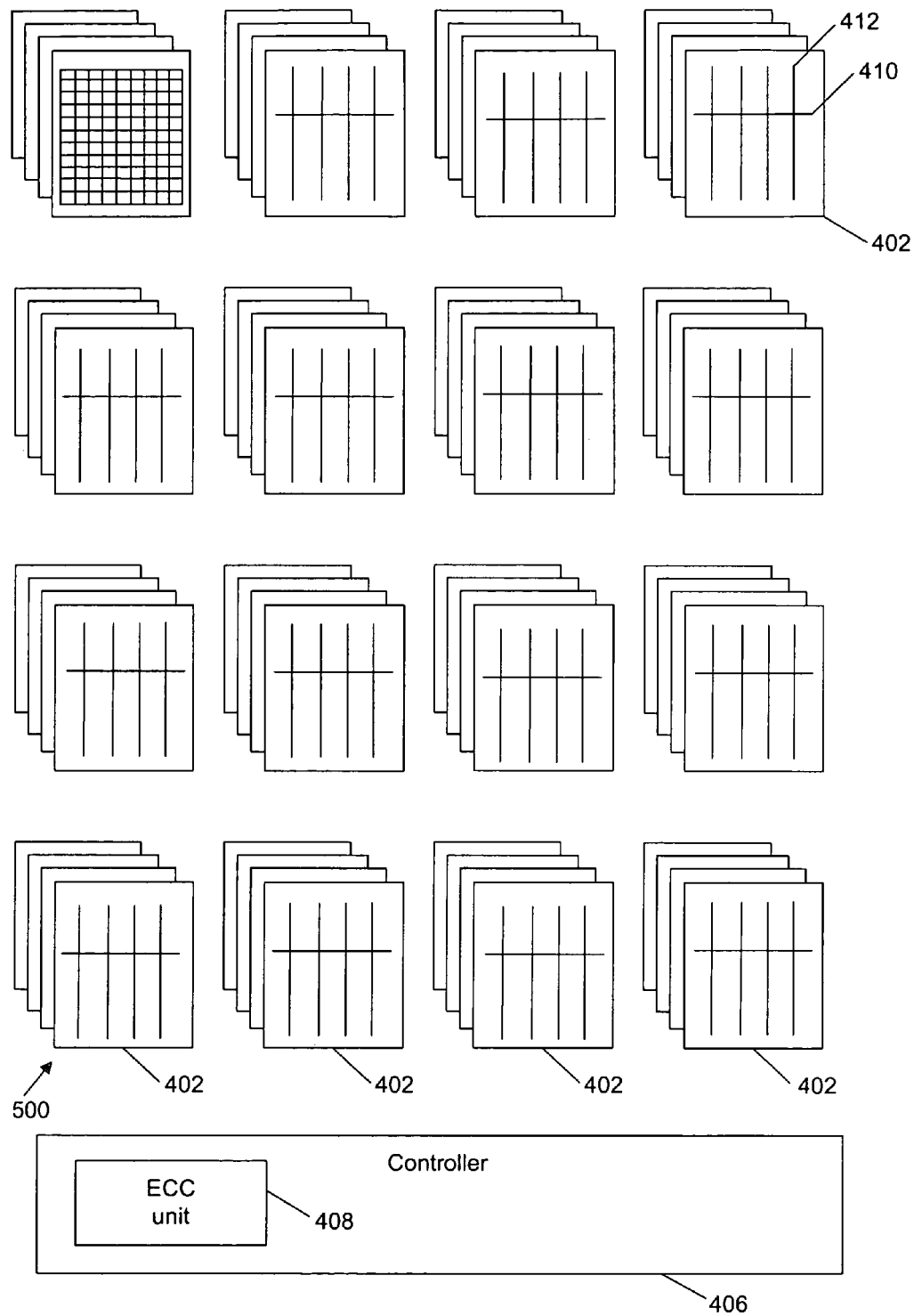
FIG. 5 illustrates the MRAM device of FIG. 4 in greater detail.

FIG. 5 illustrates an embodiment of an MRAM device in more detail. A macro-array 500 is formed comprising a large plurality of individual arrays 402, each of which is formed as discussed above for FIG. 4. The arrays 402 provide compact data storage for the MRAM device. For simplicity, FIG. 5 shows only a portion of the macro-array.

The arrays 402 can be manufactured in layers. In the example of FIG. 4, four arrays 402 are layered to form a stack. In an example device able to store 128 megabytes of original information, 160 megabytes of information might actually be stored, suitably encoded as described later using 1280 arrays arranged in a macro-array of 16 arrays wide, by 20 arrays high, with four stack layers. Further, the MRAM device may comprise more than one such macro-array.

Referring to FIG. 5, a method for accessing the MRAM device 400 comprises selecting one row 410 in each of a plurality of arrays 402, and selecting plural columns 412 from each of the plurality of arrays to thereby select a plurality of storage cells 404. The accessed cells 404 within each of the plurality of arrays 402 correspond to a small portion of a unit of data. Together, the accessed cells 404 provide a whole unit of data, such as a whole sector unit, or at least a substantial portion of the unit. Preferably, each of the plurality of arrays 402 are accessible substantially simultaneously. Therefore, device access speed for a read operation or a write operation is increased. This device access may be referred to as a slice through the macro-array.

As shown in FIG. 5, the same row address and the same column addresses can be selected in each of the plurality of arrays. A unit of data is stored across a plurality of arrays, using the same row and column addresses within each of the plurality of arrays.

As shown in FIG. 5, the arrays 402 are layered to form stacks. Only one array within each stack is preferably accessed at any one time. The plurality of arrays can be used to store a sector unit of data each in different stacks (i.e., none of the selected plurality of arrays are in the same stack). Also, arrays 402 that are all in the same layer can be selected. For example, one array 402 can be selected from each stack, the arrays each being in the same layer within each stack. In the example of FIG. 5, the topmost array 402 within each stack has been selected.

The number of arrays 402 available in the macro-array 500 may be matched to the size of a sector unit of data to be stored in the device. Here, the total number of arrays can be provided such that, given the number of cells 404 that can be simultaneously accessed in an array 402, a sector unit is stored using cells within all of the arrays 402 of a single layer of the device, to store a whole sector unit of data. In other embodiments, a reciprocal integer fraction of a sector unit of data (e.g. one half or one third or one quarter of a sector unit) can be accessible simultaneously. Note that failures can occur that affect the ability of the device to store data reliably in the storage cells 404. In one embodiment, the device 400 can perform write-read operations on various selected cells to test for errors resulting from physical failures within the device 400. In one embodiment, a cell 404 is written with a known value, such as a logical "1." If the cell 404 reads back a logical value of "0" then a defect resides in the tested cell 404. Similarly, writing a "0" to a cell 404 and reading back a "1" would indicted failure as well. The cell 404 can be written once and read repeatedly, or can be rewritten after each read, as required to maintain integrity of the cell 404. Although testing a cell 404 is discussed herein, a device can be tested through testing rows and/or columns of cells 404.

It may not be necessary to provide error correction for each bit of data. Although the storage cells of the MRAM device can be used to store data according to any suitable logical layout, data can be organized into basic sub-units (e.g., bytes) which in turn are grouped into larger logical data units (e.g., sectors). A physical failure can affect many bytes and possibly many sectors. Keeping information about each small logical sub-unit (e.g., bytes) affected by physical failures may not be efficient, due to the quantity of data involved. Attempts to produce a list of all such logical units rendered unusable due to at least one physical failure may generate a quantity of management data too large to handle efficiently. Further, depending on how the data is organized on the device, a single physical failure can potentially affect a large number of logical data units, such that avoiding use of all bytes, sectors or other units affected by a failure substantially reduces the storage capacity of the device.

An embodiment of the present invention employs error correction coding to provide a magnetoresistive solid-state storage device that is error tolerant, preferably to tolerate and recover from both random failures and systematic failures. Error correction coding generally involves receiving original information to be stored and encoding the original data into encoded data that allows errors to be identified and ideally corrected. The encoded data is stored in the solid-state storage device. At read time, the original information is recovered by error correction decoding the encoded stored data. A wide range of ECC schemes are available and can be employed alone or in combination. These wide range of ECC schemes vary in size and therefore result in varying power and time demands from the device on which they are employed. Suitable ECC schemes include both schemes with single-bit symbols (e.g., BCH) and schemes with multiple-bit symbols (e.g., Reed-Solomon).

Figure 6:
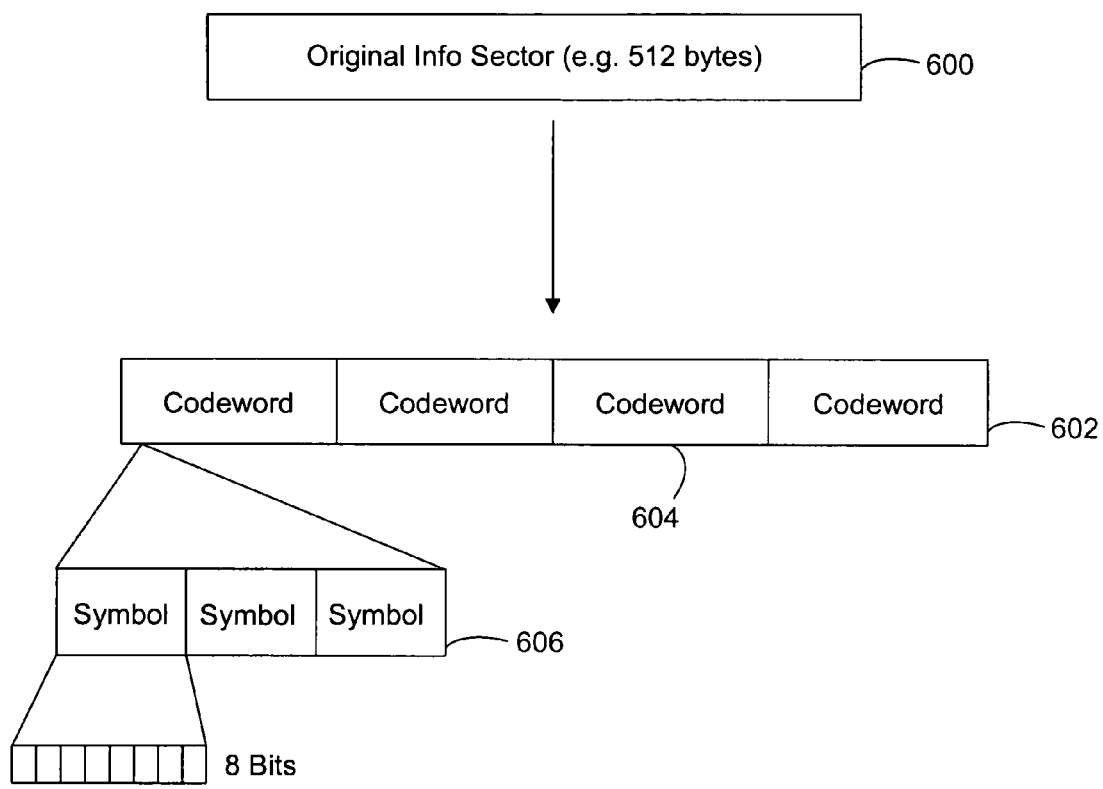
FIG. 6 illustrates a logical data structure used when storing data in the MRAM device of FIG. 4.

FIG. 6 shows an example logical data structure used when storing data in the MRAM device 402 (FIG. 4). Original information 600 is received in predetermined units, such as a sector comprising 512 bytes. Error correction coding is performed to produce ECC encoded data, in this case an encoded sector 602. The encoded sector 602 comprises a plurality of symbols 606, which can be a single bit (e.g., a BCH code with single-bit symbols) or can comprise multiple bits (e.g., a Reed-Solomon code using multi-bit symbols). In an exemplary Reed-Solomon encoding scheme, each symbol 606 comprises eight bits and, as shown in FIG. 6, each encoded sector 602 comprises four codewords 604, each comprising of the order of 144 to 160 symbols. The eight bits corresponding to each symbol can be stored in eight storage cells 404, which can be termed a symbol group. A physical failure that directly or indirectly affects any of these eight storage cells in a symbol group can result in one or more of the bits being unreliable or unreadable.

An exemplary embodiment of the present invention can employ an ECC scheme with multi-bit symbols. Where manufacturing processes and device design change over time, it may become more appropriate to organize storage locations expecting bit-based errors and then apply an ECC scheme using single-bit symbols, and at least some of the following embodiments can be applied to single-bit symbols.

Error correction decoding each block of stored ECC encoded data allows failed symbols 606 to be identified and corrected. Decoding can be performed independently for each block of ECC encoded data, such as an ECC encoded sector 602 or, in the exemplary embodiment, for each codeword 604. Hence, the encoded sector 602, or preferably each ECC word 604, forms the unit of data to be stored in the device.

A Reed-Solomon scheme is an example of a linear error correcting code, which mathematically identifies and corrects completely up to a predetermined maximum number of failed symbols 606 within each independently decodeable block of ECC encoded data, depending upon the power of the code. For example, a [160,128,33] Reed-Solomon code producing codewords having one hundred and sixty 8-bit symbols corresponding to one hundred and twenty-eight original information bytes and a minimum distance of thirty-three symbols can locate and correct up to sixteen symbol errors.

It is desirable to minimize the amount of memory used to store the ECC as well as minimize the power and the amount of time required to run the ECC. As such, ECC's having varying power levels are available. Generally, a high power level ECC is capable of more extensive error correction than a low power level ECC. The power level of the ECC to be implemented is determined by the severity of failures in the device 400 and/or the level of accuracy needed from the device 400.

Figure 7:
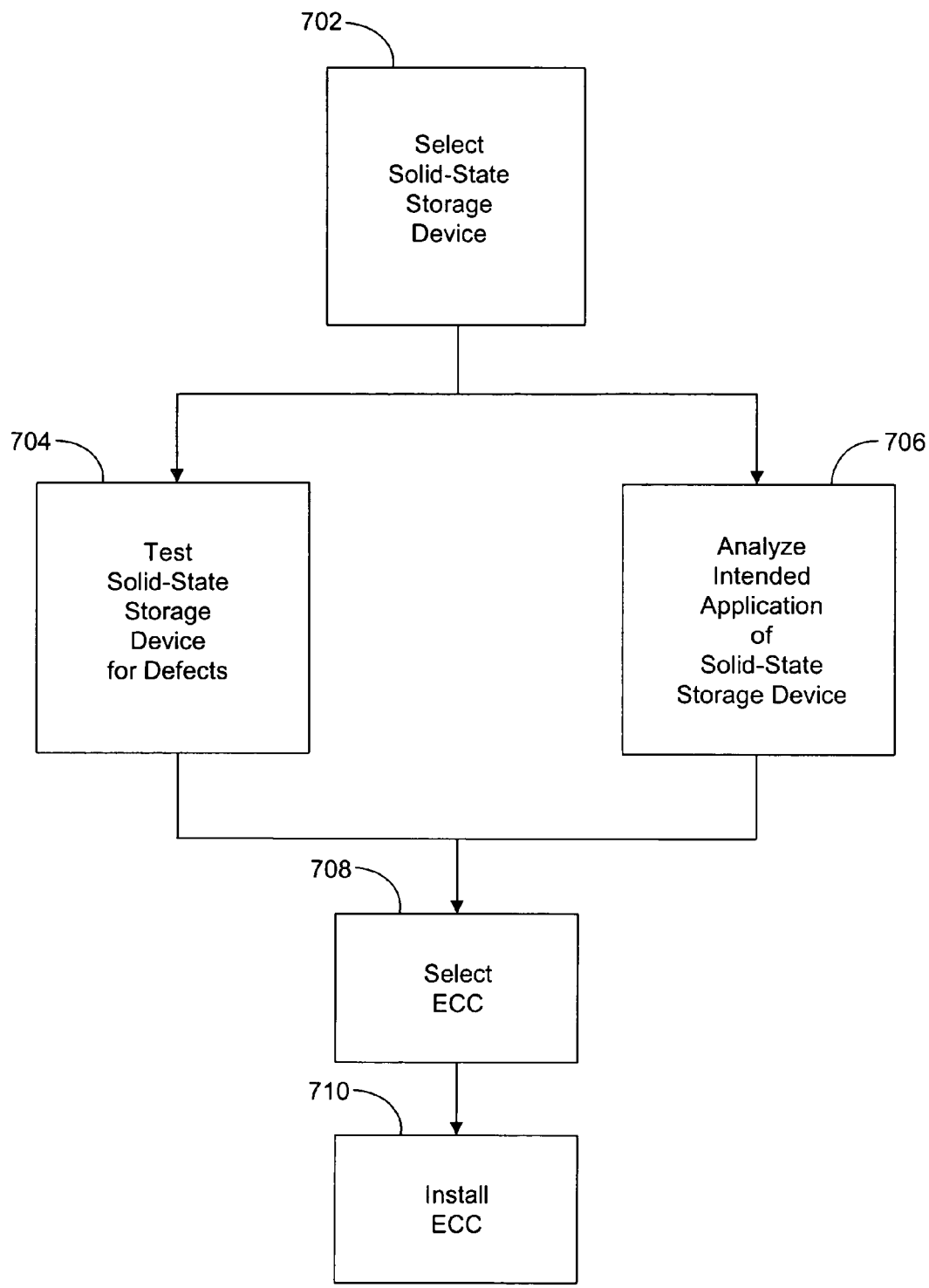
FIG. 7 is a flowchart for selecting a power level configured ECC for use with the MRAM device of FIG. 4.

FIG. 7 illustrates a method for determining the desired power level ECC. First, a device 400 is selected in block 702. For example, the device 400 can be selected off of an assembly line after manufacturing or selected by a user of an end product in which the device 400 is installed. The device 400 can also be selected for testing by running a self-test periodically over time. As previously addressed, such a device 400 typically has some defects after manufacturing, and the device 400 can also deteriorate and develop defects over time, for various reasons.

The device 400 is tested in block 704 for defects in the manner disclosed above, such as with a write-read operation, or in any suitable manner. From testing the unit for defects, it can be determined how defective the unit is and, therefore, to what extent the device will need error correction coding to provide a less defective device 400 or a device 400 having an error rate at or below a desired threshold. A device 400 can also be tested, in the manner disclosed herein, periodically throughout the use of the device 400. In one embodiment, the results of consecutive tests on one device 400 can be compared and a rate of deterioration determined. This rate of deterioration may then be used as a factor in selecting the desired ECC scheme. The intended application of the unit can also, or in the alternative to testing, be analyzed in block 706.

Based on the desired selection factors, an ECC scheme having a given power level configuration is selected in block 708. A device 400 having a substantial number of defects as revealed by the testing 704 may require a higher power level ECC, while a less defective device 400 may require a less powerful ECC. A less intense application for the storage device 400 can tolerate a lower level of error correction. For example, the use of the storage device 400 for the storage of images on a digital camera can tolerate a lower level of error correction than the use of the memory unit for financial or safety applications. Taking into account information such as the defects of the device, the change or increase in defects and/or the intended application of the unit, an appropriate power level configured error correction coding can be selected in block 708. It is desirable to select an ECC that provides the needed level of error correction without burdening the system with more error correction than necessary. Upon selection of the desired ECC 708 the ECC can be installed 710 in the storage device 400. Note that the selection of the ECC to be installed may be automatically performed by the ECC selection system 100 based on one or more predefined criteria, as described above, or in the alternative, a user may manually select the desired ECC and provide an input indicative of the desired ECC that is to be installed in the storage device 400.

To better illustrate an exemplary method for selecting a desired ECC power level, an exemplary use and operation of the ECC selection system 100 depicted by FIG. 2 will be described. For illustrative purposes, assume that the storage device 400 depicted by FIG. 4 is to be used in an application where it is desirable for the device 400 to have an error rate below a specified threshold, referred to hereafter as "$T_{error}$." This threshold may be stored within the memory 206 of the ECC selection system 100. In this regard, the ECC selection system 100 may store the desired thresholds for various applications, and the ECC selection system 100 may be configured to select one of the stored thresholds for each of the storage devices 400 handled by the system 100 based on the intended application for the device 400, as will be described in more detail below.

Initially, the ECC selection system 100 receives information indicative of the intended application of the storage device 400. Based on this information, the ECC selection system 100 retrieves the threshold correlated with the intended application (i.e., the selection system 100 retrieves $T_{error}$ in the instant example). The ECC selection system 100 also tests the storage device 400 to determine the device's actual error rate. The ECC selection system 100 then selects an ECC scheme or power level that will provide the device 400 with an error rate at or below $T_{error}$.

As an example, the ECC selection system 100 may compare the actual error rate to $T_{error}$. If the difference between the actual error rate and $T_{error}$ is small, then the ECC selection system 100 may select a first ECC scheme. However, if the difference between the actual error rate and $T_{error}$ is large (e.g., above a specified threshold), then the ECC selection 100 may instead select a second ECC scheme that is more robust than the first ECC scheme. Indeed, the ECC selection system 100 may estimate the likely error rate that each possible ECC scheme will yield and then select the ECC scheme that is estimated to provide an error rate that is below $T_{error}$. To minimize the impact on the performance of the storage device 400, the ECC selection system 100 may select the ECC scheme that is estimated to provide the highest error rate that is below $T_{error}$. However, in other embodiments, other techniques for selecting a suitable ECC scheme may be implemented. For example, a more robust ECC scheme may be selected for the storage device 400 if the system 100 receives information indicating that the deterioration of the device 400 is relatively high (e.g., exceeds a specified threshold).

After selecting an ECC scheme, as described above, the ECC selection system 100 then installs, in the storage device 400, a set of ECC for implementing the selected ECC scheme. During operation of the device 400, the installed ECC corrects for errors occurring within the device 400 such that the actual error rate of the device remains below $T_{error}$. However, after a period of prolonged use, the device 400 may be retested by the ECC system 100 to determine whether a more robust ECC scheme is needed to keep the device's error rate below $T_{error}$.

It should be noted that the presence of shorted bit and open bit failures associated with a relatively few code words can significantly impact the overall error rate of the device 400. The device's error rate can be significantly reduced by detecting, at manufacture or periodically during use, code words that are associated with shorted bit and open bit failures and then excluding such words from subsequent use. Techniques for achieving the foregoing are described in more detail in commonly-assigned U.S. patent application Nos. 2003/0023922 A1, 2003/0023925 A1, and 2003/0023928 A1, which are all incorporated herein by reference.

A magnetoresistive solid-state storage device and method for selecting error correction coding based on at least defects and, or in the alternative, intended use of the device is described. The storage device is able to tolerate a relatively large number of errors, including both systematic failures and transient failures, while successfully remaining in operation with minimization of the loss of original data, through the use of error correction coding. Simpler and lower cost manufacturing techniques are employed and/or device yield and device density are increased. Error correction coding and decoding allows blocks of data, e.g. sectors or codewords, to remain in use, where otherwise the whole block can be discarded if only one failure occurs. As refinements in the manufacturing process reduce the mean number of defective cells, error correction overhead in the stored encoded data can be reduced and/or reduced device error rates can be obtained for the same overhead.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to exemplary embodiments of the invention and its practical application to thereby enable one of ordinary skill in the art to utilize the invention in various embodiments and with various modifications as are suited to the particular use contemplated.

The invention of claimed is:

1. A method for configuring solid-state storage devices, comprising:
   providing a solid-state storage device;
   analyzing an error rate of said solid-state storage device; and
   selecting, based on said error rate, an error correction code power level to provide said solid-state storage device with a pre-determined error rate.

2. The method of claim 1, further comprising analyzing an intended user application of said solid-state storage device, wherein said selecting is further based on said intended user application.

3. The method of claim 1, wherein said selecting further comprises switching a selector lever to select a desired error correction code.

4. The method of claim 1, wherein said solid-state storage device comprises a plurality of magnetoresistive storage cells.

5. The method of claim 1, further comprising determining a rate of deterioration of said storage device, wherein said selecting is further based on said rate of deterioration.

6. The method of claim 1, wherein said analyzing said error rate of said solid-state storage device further comprises:
   testing said solid-state storage device for defects;
   determining said error rate of said solid-state storage device based on said testing; and
   comparing said error rate of said solid-state storage device to said pre-determined error rate.

7. The method of claim 6, wherein said testing further comprises performing a write-read-compare operation on at least one selected cell.

8. A method for configuring solid-state storage devices, comprising:
   determining a value indicative of an error rate for a solid-storage device;
   selecting an error correction code based on said value; and
   installing said selected error correction code in said solid-state storage device.

9. The method of claim 8, wherein said selecting is further based on an intended application for said solid-state storage device.

10. The method of claim 8, further comprising comparing said value to a pre-determined threshold, wherein said selecting is based on said comparing.

11. The method of claim 8, further comprising:
    determining a value indicative of a rate of deterioration of said storage device; and
    comparing, to a threshold, said value indicative of said rate of deterioration, wherein said selecting is based on said comparing.

12. A system for configuring solid-state storage devices, comprising:
   a solid-state storage device; and
   an error correction code (ECC) selection system configured to automatically select
   an error correction code based on an error rate of said storage device, said ECC selection system further configured to install said selected set-of error correction code in said solid-state storage device.

13. The system of claim 12, wherein said ECC selection system is further configured to receive information indicative of an intended application for said storage device and to select said error correction code based on said information.

14. The system of claim 12, wherein said ECC selection system is configured to determine a value indicative of said error rate and to compare said value to a pre-determined threshold.

15. The system of claim 12, wherein said ECC selection system is configured to select said error correction code based on a rate of deterioration of said storage device.

16. A computer-readable medium having a program capable of being executed by an instruction execution system, said program comprising:
   logic configured to receive information corresponding to a solid-state storage device;
   logic configured to analyze said information corresponding to said solid-state storage device; and
   logic configured to select an error correction code for use with said solid-state storage device based on said information received corresponding to said solid-state storage device.

17. The computer-readable medium of claim 16, wherein said information is indicative of an error rate for said storage device.

18. The computer-readable medium of claim 17, wherein said information is further indicative of an intended application for said storage device.

19. The computer-readable medium of claim 18, wherein said information is further indicative of a rate of deterioration for said storage device.

20. A system for configuring solid-state storage devices, comprising:
   means for testing a solid-state storage device and for determining a value indicative of an error rate for said storage device;
   means for comparing said value to a pre-determined threshold;
   means for selecting an error correction code based on said comparing means; and
   means for installing said selected error correction code in said storage device.

21. The system of claim 20, wherein said selecting means is further configured to select said error correction code based on an intended application for said storage device.

22. The system of claim 20, wherein said selecting means is further configured to select said error correction code based on a rate of deterioration for said storage device.

* * * * *

UNITED STATES PATENT AND TRADEMARK OFFICE
CERTIFICATE OF CORRECTION

| | |
|---|---|
| PATENT NO. | : 7,210,077 B2 |
| APPLICATION NO. | : 10/767188 |
| DATED | : April 24, 2007 |
| INVENTOR(S) | : Sarah Morris Brandenberger et al. |

It is certified that error appears in the above-identified patent and that said Letters Patent is hereby corrected as shown below:

In column 10, line 53, in Claim 8, delete "solid-storage" and insert -- solid-state storage --, therefor.

In column 11, line 9, in Claim 12, after "selected" delete "set-of".

Signed and Sealed this

Fourth Day of November, 2008

JON W. DUDAS
*Director of the United States Patent and Trademark Office*